Figure 1A:
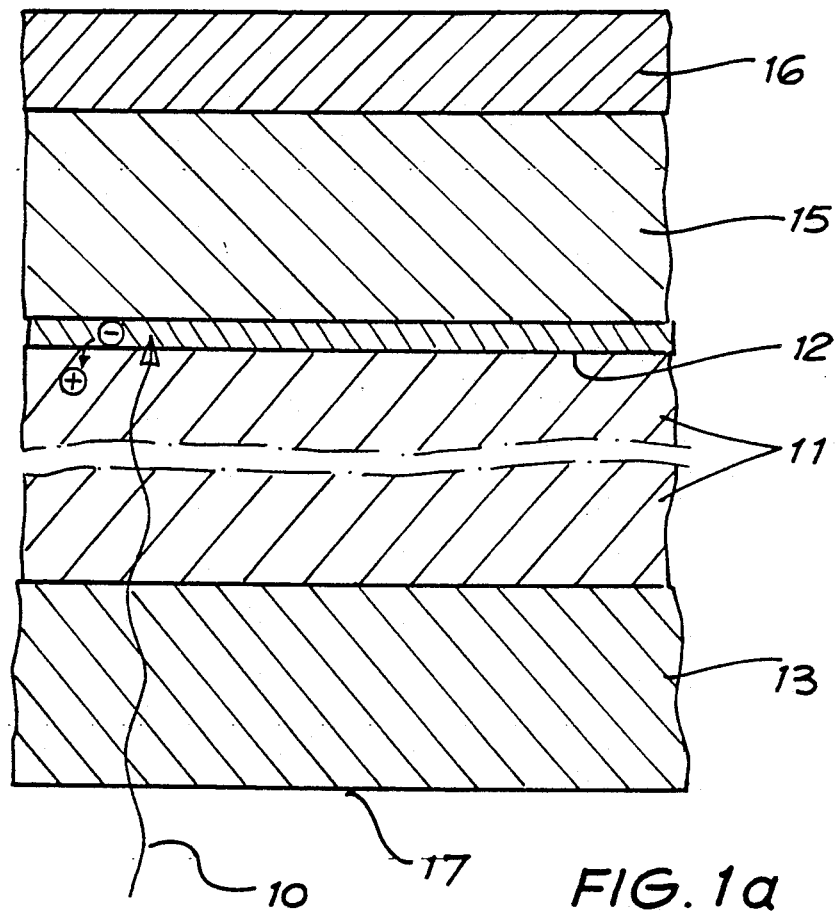

United States Patent [19]

Kurianski et al.

[11] Patent Number: 5,001,530
[45] Date of Patent: Mar. 19, 1991

[54] INFRARED SCHOTTKY JUNCTION CHARGE COUPLED DEVICE

[75] Inventors: Jerzy M. Kurianski, Clovelly; Martin A. Green, Waverley, both of Australia

[73] Assignee: Unisearch Limited, New South Wales, Australia

[21] Appl. No.: 315,246

[22] Filed: Feb. 24, 1989

Related U.S. Application Data

[63] Continuation of Ser. No. 903,119, Sep. 3, 1986, abandoned.

[30] Foreign Application Priority Data

Sep. 4, 1985 [AU] Australia .............................. PH02286

[51] Int. Cl.$^5$ ................. H01L 31/108; H01L 29/812; H01L 29/816
[52] U.S. Cl. ....................................... 357/24; 357/15; 357/30
[58] Field of Search ................. 357/24 M, 24 LR, 15, 357/30 C

[56] References Cited

U.S. PATENT DOCUMENTS

| | | | |
|---|---|---|---|
| 3,739,240 | 6/1973 | Krambeck | 357/24 M |
| 3,806,729 | 4/1974 | Caywood | 357/24 LR |
| 3,858,232 | 12/1974 | Boyle et al. | 357/24 |
| 4,028,716 | 6/1977 | van Santen et al. | 357/24 M |
| 4,228,365 | 10/1980 | Gutierrez et al. | 357/24 M |
| 4,561,005 | 12/1985 | Shannon | 357/24 LR |
| 4,779,124 | 10/1988 | Hynecek | 357/221 |

FOREIGN PATENT DOCUMENTS 37200 10/1981 European Pat. Off. ......... 357/24 M

OTHER PUBLICATIONS

Kohn, IEEE J. of Solid State Circuits, vol. SC11, No. 1, Feb. 1976, pp. 139-146.
F. L. Schuemeyer, R. A. Belt, C. R. Young and J. M. Blasinggame, "New Structures for Charge-Coupled Devices", Proc. IEEE, vol. 60, pp. 1444-1445, 1972.
D. K. Schroder, "Schottky Barrier Gate Charge-Coupled Devices", in Metal-Semiconductor Schottky Barrier Junctions and Their Applications, B. L. Sharma (ed.), Plenum, New York, 1984, pp. 293-333 (recent review).
H. Elabd and W. F. Kosonocky, "Theory and Measurements of Photoresponse for Thin Film Pd$_2$Si and PtSi Infrared Schottky-Barrier Detectors with Optical Cavity", RCA Review, Dec. 1982, 21 pages.
W. F. Kosonocky, F. V. Shallcross, T. S. Villani and J. V. Groppe, "160×244 Element PtSi Schottky-Barrier IR-CCD Image Sensor", IEEE Trans. on Electron Devices, vol. ED-32, 1985, pp. 1564-1573.

Primary Examiner—William D. Larkins
Attorney, Agent, or Firm—Nixon & Vanderhye

[57] ABSTRACT

A Schottky barrier CCD infra-red (IR) detector array having Schottky junction IR sensitive gates as the transfer gates of the CCD array. These Schottky gates perform both IR detection and CCD shift register function within the array, thereby improving the fill factor and/or pixel size of the device.

22 Claims, 6 Drawing Sheets

INFRARED SCHOTTKY JUNCTION CHARGE COUPLED DEVICE

This is a continuation of application Ser. No. 6,903,119, filed Sept. 3, 1986, now abandoned.

The present invention relates to photo-optic detector arrays and in particular the invention provides a detector array wherein each of the detector elements forms one of the junction gates in infra-red Schottky Junction Charge Couple Device (IR SJ CCD) array.

Prior art silicide infra-red detector arrays are known wherein vertical and horizontal Charge Coupled Device (CCD) shift registers are provided to transfer charges developed on detector elements to the array output, however, due to the area occupied by the CCD shift registers, the maximum fill factor (the ratio of active detector area to the area of the whole device) is in practice on the order of 25%. By contrast, with devices made in accordance with the present invention much higher fill factors can be achieved due to the fact that the detector elements themselves form elements of Schottky Junction Charge Coupled Devices (SJ CCD).

The present invention consists in a junction CCD array comprising a plurality of transfer gates wherein at least some of the gates are Schottky junction infra-red (IR) sensitive gates which operate in a first mode as IR detection elements and in a second mode as gates of a CCD shift register.

Preferably, a plurality of linear arrays will be formed side by side to provide the rows of a two dimensional array, each of the linear arrays being fed to a vertical CCD (or a SJ CCD) via which the linear arrays are connected to the output of the two dimensional array.

In one form of the invention, the charges generated in the linear arrays may be transferred very quickly to a conventional (not IR sensitive) two dimensional CCD array for a later slow readout. Alternatively a Schottky junction CCD array may be used instead of a conventional array, wherein the further Schottky junction array is shielded from radiation.

Figure 2A:
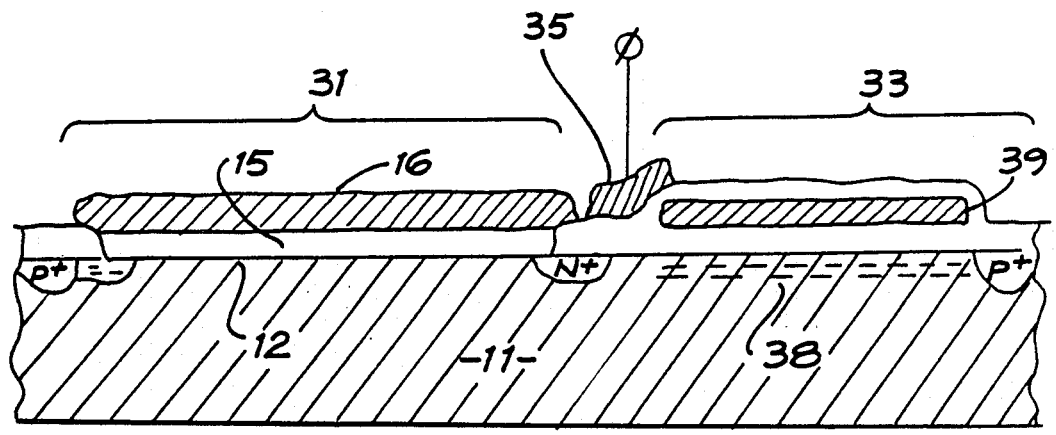
Figure 3A:
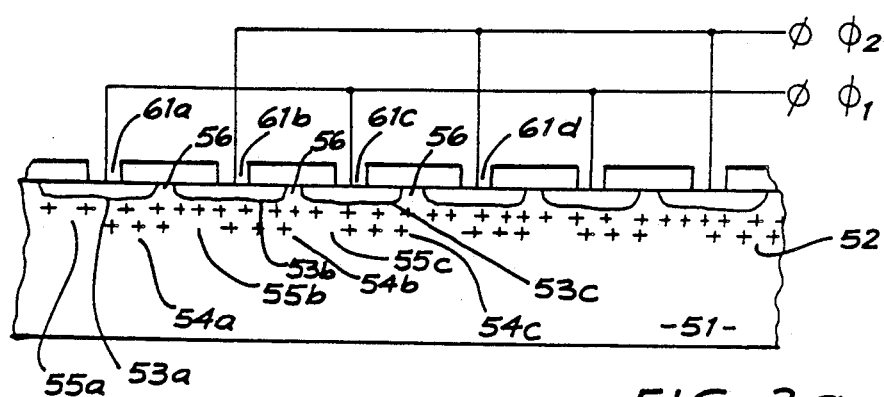
Figure 4A:
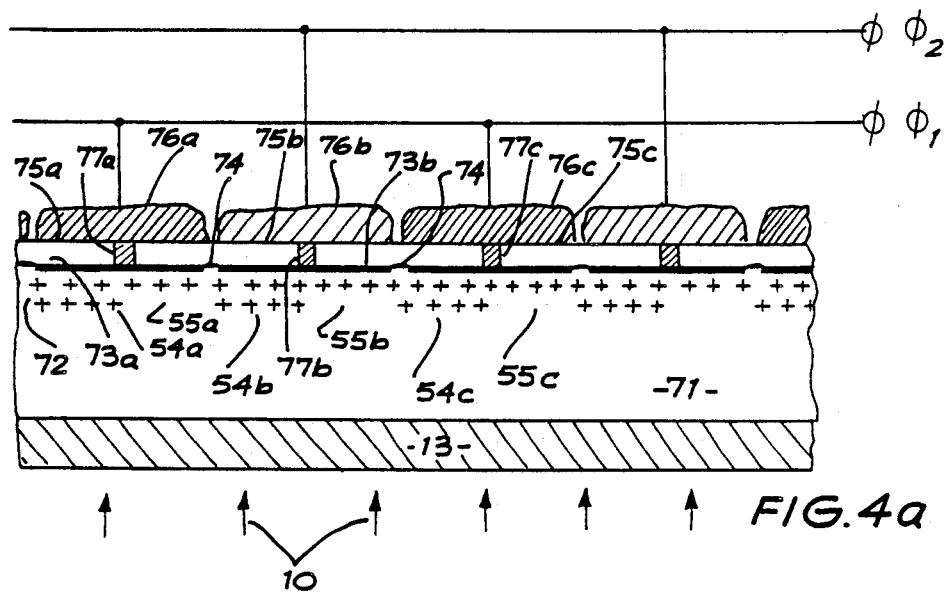
Figure 5A:
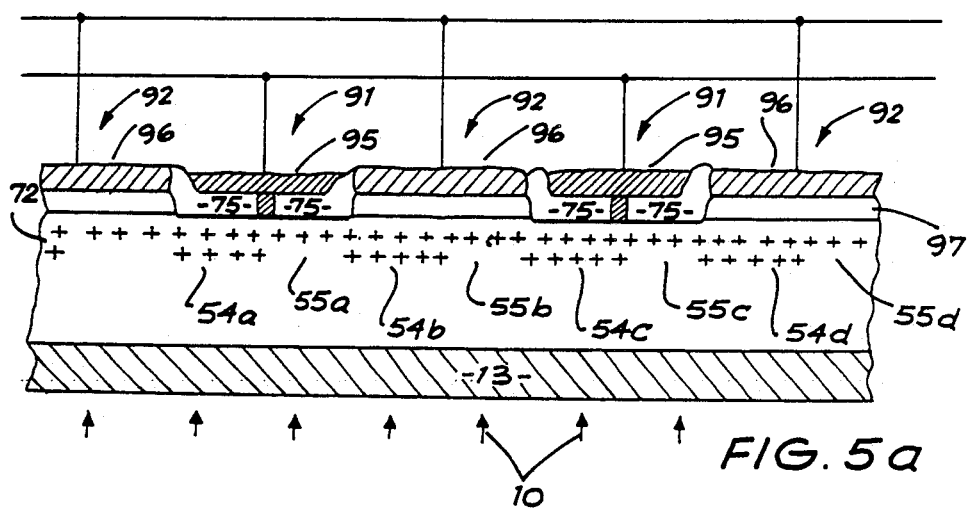

The present invention will now be described by way of example with reference to the accompanying drawings, in which:

FIG. 1 schematically illustrates (a) the basic structure of a metal-silicide Schottky barrier infra-red detector, and (b) the energy diagram for the detector of FIG. 1a showing the photo detection process;

FIG. 2 schematically illustrates (a) a sectional elevation of the detector region, transfer gate and horizontal shift register of a conventional Schottky barrier infra-red detector array, (b) a partial plan view of the array from FIG. 2a;

FIG. 3 schematically illustrates the operation of a junction CCD, showing (a) a schematic illustration of a sectional elevation of a two phase junction CCD with diffused gates, and (b) a potential profile in the channel of the device of FIG. 3a when symmetrical square wave clocks 180 degree out of phase are applied to the gates;

FIG. 4 schematically illustrates (a) a partial section elevation of a two phase infra-red full Schottky Junction CCD two dimensional array made in accordance with the present invention, and (b) a plan view of the device of FIG. 4a;

FIG. 5 schematically illustrates (a) a partial sectional elevation of a two phase infra-red half Schottky Junction CCD two dimensional array made in accordance with the present invention, and (b) a plan view of the device of FIG. 5a.

The basic structure of a metal silicide Schottky barrier infra-red detector is illustrated in FIG. 1a. from which it will be noted that photons of light 10 are transmitted from the back surface 17 of a detector to the silicide layer 12 via a dielectric anti-reflecting coating 13 and a p-type silicon substrate 11. Silicide of metals such as iridium, platinum or palladium are characterized by low Schottky barrier height for p-type silicon. The quantum efficiency of the silicide infra-red detector is improved by putting an optical cavity on top of the thin silicide layer comprising a dielectric layer 15 and an aluminium mirror 16 such that light passing through the silicide traverses the dielectric layer 15 and is reflected by the aluminium mirror 16 thereby providing additional opportunities for transmitted photons to be absorbed by silicide layer 12. The Dielectric-silicide interface increases the probability of reflection of high energy holes in the direction of the silicon substrate thereby increasing quantum efficiency as well.

Figure 1B:
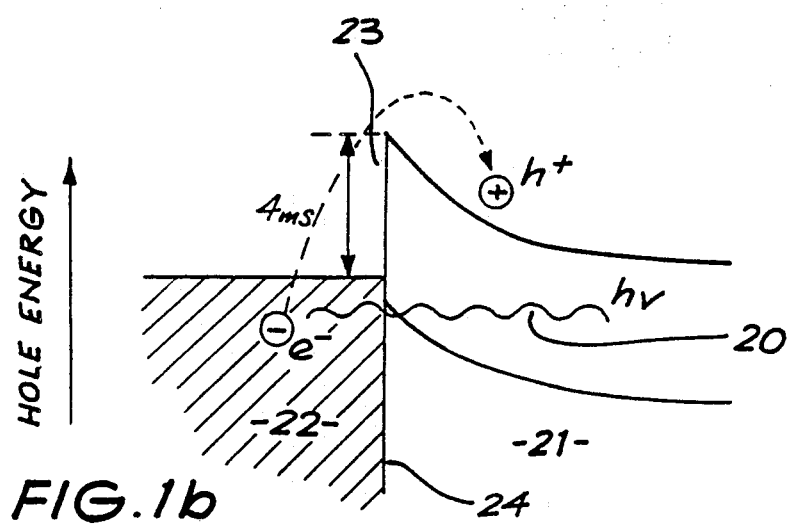

Referring to FIG. 1b, the absorption of infra-red photons 20 takes place in the metal silicide 22 and these photons effectively excite holes (or vacancies) in the silicide 22 to higher energy states. Only those holes excited to energies above the Schottky barrier level 23 can be emitted across the silicide-silicon junction 24 thereby generating negative charges in the silicide 22 and positive charges in the silicon substrate 21.

Figure 2B:
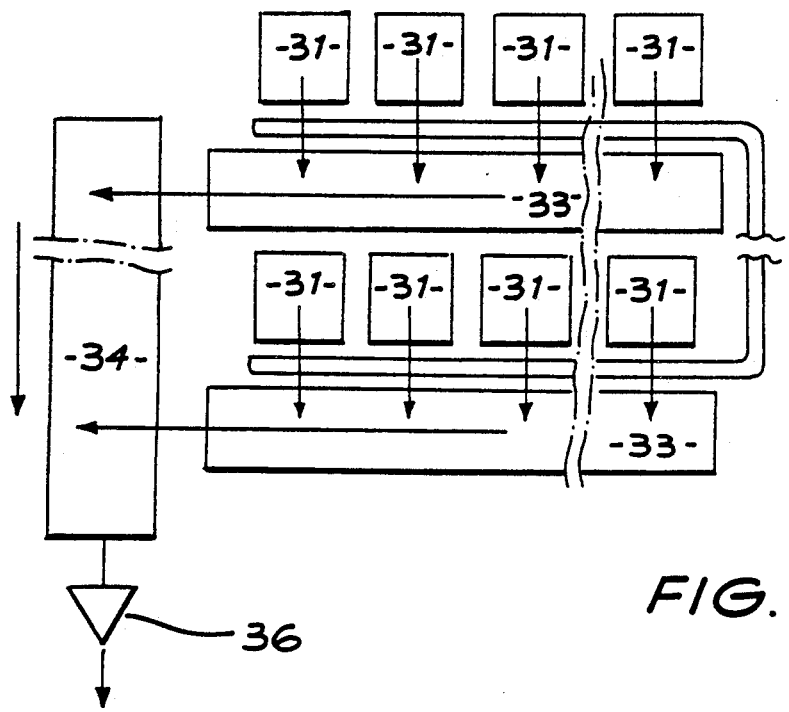

The basic architecture of a conventional infra-red detector array is shown in FIG. 2b, in which an array of infra-red detectors 31, basically of the form described with reference to FIGS. 1a and 1b, are formed on silicon substrate 11 and interconnected by horizontal and vertical charge coupled devices (CCD's) 33, 34. In order to read out the signal charges, all detectors are connected to horizontal CCD's by switching transistors 35, which act as transfer gates, to simultaneously transfer the charges accumulated in each of the infra-red detectors 31 into a respective element of one of the horizontal CCD's 33. The CCD's 33, 34 are then operated as shift registers to transfer the signal charges to the output 36 of the detector array. Since CCD's and transfer gates occupy a substantial proportion of the total device area, the detector coverage (fill factor) of conventional infra-red detector array is about 25% of the total device area.

Referring to the FIG. 2a, a cross-sectional view of a sensing region 31, transfer gate 35, and CCD storage element 33 of an infra-red CCD array it is clearly seen that the transfer gates 35 and horizontal CCD shift registers 33 have to occupy a substantial proportion of the device area. In operation, once the charge has been generated in the sensing region of the metal silicide layer 12, a voltage is applied to the transfer gate 35 and to a poly gate 39 of the CCD element 33 in contact with it, such that the charge accumulated in the detector will flow from the sensing region into a CCD element Prior to the application of the voltage to the transfer gate, a barrier existed under the transfer gate 35 which maintained the accumulated charge within the sensing region 31. However, application of a voltage to the transfer gate 35 and the CCD element 33 simultaneously removes the barrier, and at the same time produces a deep potential well in the channel (N-implant) 38 under the CCD element 33, into which the charge will readily flow from the sensing region 31. Once the charge has been transferred to the CCD channel 33 standard charge coupled device shifting techniques are used to transfer this charge and the charges from the remainder of the sensing regions to the output of the detector array.

Figure 3B:
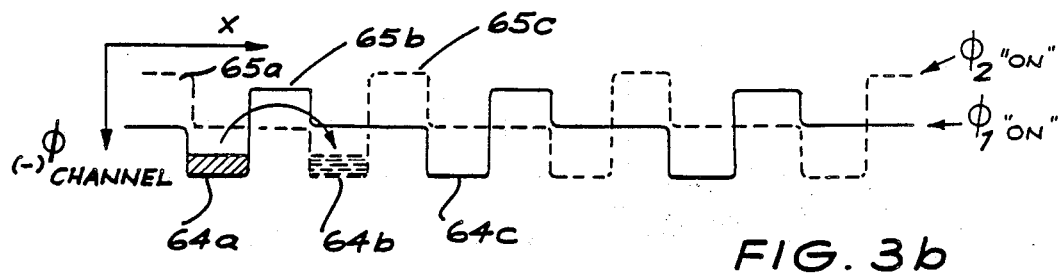

Referring to FIG. 3, the following description of device operation is done for a device made on n-type silicon substrate but is valid for devices made on p-type substrate with the requirement that doping type will be changed and voltage polarity reversed. Junction CCD operation is in principle very similar to the operation of a buried channel CCD with conventional metal-oxide semiconductor (MOS) gates where charge is transported in a channel buried under the silicon surface (few microns deep). The charge is moved as a result of the existence of a transfer gradient in the channel potential created by means of MOS gates. In a junction CCD as illustrated in FIGS. 3a and 3b the role of MOS gates is played by the reverse biased p-n junctions which provide the means of transfer gradient creation in the underlying channel.

The device of FIG. 3a is a two phase junction CCD made on an n-type silicon substrate 51 with a p-type implanted channel 52 which has an inbuilt non uniform profile. Under each junction gate 61 (N+diffusion 53) the p-type channel has two distinct regions; the well region 54 with a heavy P- implant where charge is stored during transfer, and the barrier region 55 with a light P-implant which ensures that the transfer is unidirectional. The CCD gates 53 are shallow N+ diffusions made on the top of the p-type channel with gaps 56 of a few microns between them. Alternate gates 61 are electrically interconnected and each set of interconnected gates (61a, c, etc, and 61b, d, etc.) are connected to a respective phase of a two phase clock where the phases are symmetrical square waves, 180 degrees out of phase with each other. The charge transfer is confined to the p-type channel by two heavy N+ stop diffusions on both sides of the CCD line (not shown on the FIG. 3a).

The device operation description assumes that the p-type channel is depleted by the reset transistor of an output stage (not shown on FIG. 3a) connected to a high negative voltage with respect to the substrate (above the channel "pinch off" value). The phase voltages $\phi_1$ and $\phi_2$ applied to the CCD gates have to be positive with respect to the channel potential (less negative with respect to the substrate than the channel potential is) such that the gate-channel n-p junctions are reverse biased at all times, thereby ensuring that no charge flows from the gates 61 to the previous channel. Let us assume now that the phase 1 is "on" and phase 2 is "off" which means that the $\phi_1$ voltage has a higher negative value than $\phi_2$ voltage and, of the two gates 61a and 61b (FIG. 3a), the channel potential will be lowest in the well region under the gate 61a (in the P− implant 54a, a few microns under the surface and N+gate diffusion 53a). When charges are injected (positive for p-type channel) under gate 61a, they will flow to the well region 64a, (FIG. 3b) under that gate as the locally lowest potential place. Providing that the charges will not over fill the potential well, they will stay there until the change in phase voltage takes place. When phase 1 turns "off" and phase 2 turns "on", the existing potential well 64a under gate 61a will collapse and the charge will flow through the barrier region 55b under gate 61b and into the well region 54b under gate 61b as the presently lowest potential place. The charges can not flow "backwards" from the well region 54a under gate 61a since the barrier region 55a of that gate prevents it. Applying phase voltages alternatively to the gates we can in the same manner transfer a packet of charges (holes for p-type channel) unidirectionally, inside the p-type implanted channel. It is possible to transport in the described device a multiple of charge packages (under each second gate) at the same time.

When charges are injected (positive for p-type channel) under gate 61a, they will flow to the well region 54a under that gate as the locally lowest potential place 64a of FIG. 3b. Providing that the charges will not over fill the potential well, they will stay there until the change in phase voltage takes place. When phase 1 turns "off" and phase 2 turns "on", the existing potential well 64a under gate 61a will collapse and the charge will flow through the barrier region 55b under gate 61b and into the well region 54b under gate 61b as the presently lowest potential place 65b of FIG. 3b. The charges cannot flow "backwards" from the well region 54a under gate 61a since the barrier region 55a of that gate prevents it by interposing the potential step 65a of FIG. 3b.

Referring to FIG. 4a, a partial section elevation of a two phase infra-red full Schottky Junction CCD two dimensional array made in accordance with the present invention is shown. The device is made on an n-type silicon substrate 71 with a profiled p-type implant channel 72 as described with reference to FIG. 3a. The CCD gates 73 are made of metal silicide on the top of the p-type channel 72 with gaps 74 of a few microns between them. The device is covered by a layer of dielectric 75 with metal lines 76 overlying the silicide gates 73. The metal lines are electrically connected to the underlying silicide gates 73 through holes 77 in the dielectric 75. Alternate gates 73 are electrically interconnected and each set of interconnected gates (73a, c, etc. and 73b, d, etc) are connected to a respective phase ($\phi_1$ or $\phi_2$) of a two phase clock pulse generator. A two dimensional array (refer to FIG. 4b) is built from several horizontal infra-red Schottky Junction CCD lines 81 separated by channel stop diffusions 82 which bound the charge transport to the p-type channels of individual CCD lines 81.

The device operation is divided into two modes; the integration or detection mode and the read-out mode respectively. During the integration mode the silicide gates, and their respective overlying dielectric and metal layers, work as infra-red detectors as described with reference to FIGS. 1 and 4a where the silicide is an infra-red sensitive region and the dielectric with overlying metal may act as an optical cavity of the detector in addition to its main role. The infra-red radiation coming from the substrate direction generates charges in the infra-red sensitive region where positive charges (holes) are ejected to the p-type channel. When the phase 1 is "on" during the integration mode the charges will accumulate in the well regions of the gates connected to that phase and they will choose the shortest way to go to these regions of lowest potential from the regions where they were generated. The size of the charge packages accumulated under the gates during the integration is proportional to the amount of infra-red radiation falling in their close proximity. Thus an infra-red line image or two dimensional image is generated from a one or two dimensional array respectively.

After operating in the integration mode for a predetermined period, the second mode of operation is initiated, within which the accumulated charge is read out to the output stage. During this mode, the device has either to be covered from infra-red light (by a shutter) to prevent additional charge generation thus avoiding image "smear", or alternatively it is possible to avoid the use of the shutter by very fast transfer of the changes from the horizontal lines into a conventional CCD array (non-detecting) for later slow read-out. In the read-out mode the silicide gates work as junction gates of a junction CCD as described in reference to FIG. 3. The silicide-silicon Schottky junction behaves as a reverse biased p-n junction and is used in that capacity for charge transfer in the infra-red Schottky Junction CCD. Applying the proper phase voltages to the IR SJ CCD gates we can transfer the whole infrared generated image charge to the output stage as described with reference to FIG. 3. In the case of a two dimensional array (FIG. 4b) the signal is transferred from all horizontal line IR SJ CCD's 81, column by column, to the vertical CCD (which can be either an infra-red Schottky Junction CCD type or a conventional CCD) 83 which transports them to the output stage 84.

The infra-red sensitive area of the described device occupies all of the surface of the device except for gaps of a few microns between the junction gates and the narrow channel stop diffusion 82 between the horizontal IR SJ CCD lines 81. This allows for the fill factor to be higher than 90% and pixel density to be very high at the same time.

Figure 4B:
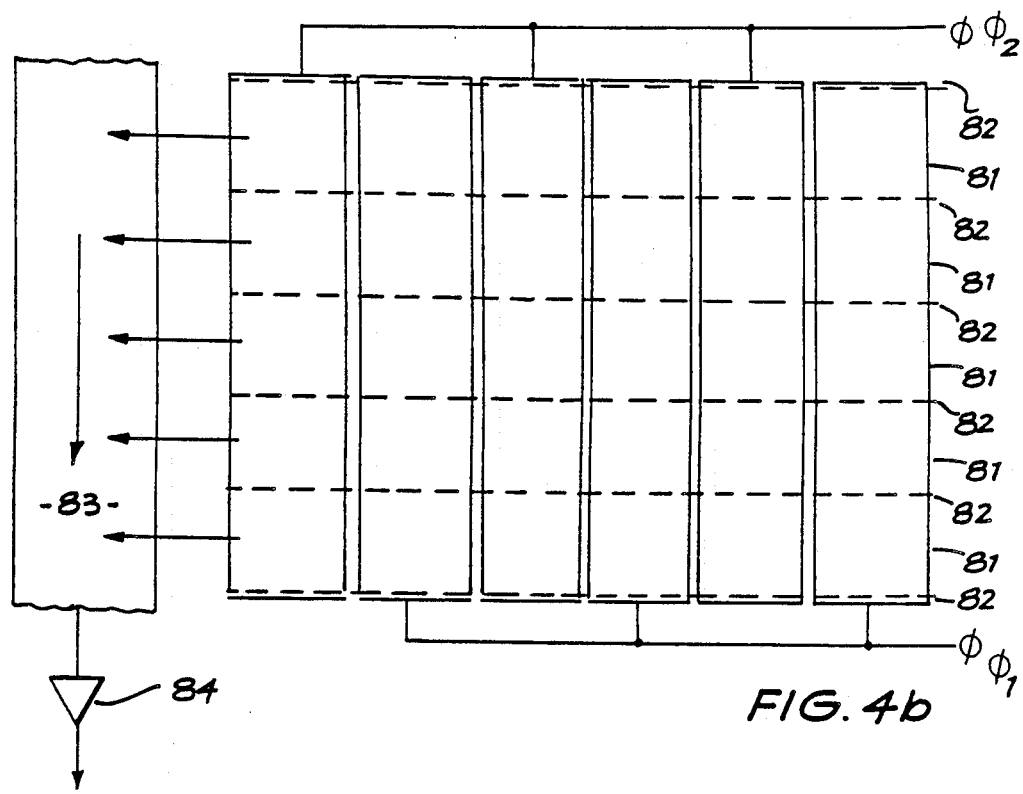
Figure 4C:
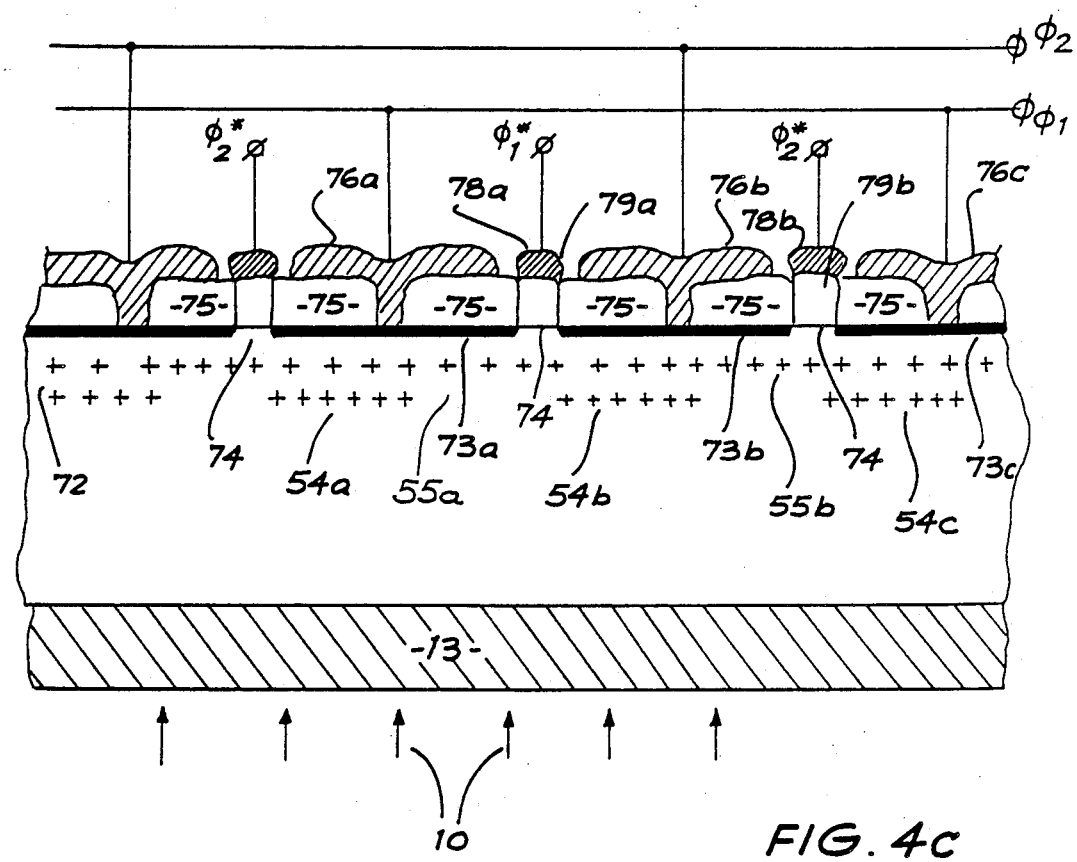

Referring to FIG. 4c, a partial section elevation of a two phase infra-red full Schottky Junction CCD is illustrated which is very similar in the design and operation to the device described in reference to FIG. 4a,b.

The device of FIG. 4c differs from the device of FIG. 4a in that it has narrow poly gates (78) between Schottky gates (73) of the CCD array.

The poly gates (78) are lying on silicon dioxide (79) and above gaps 74 on the barrier part of the implant channel 55. The device fabrication sequence is such that the storage part of the implant channel 54a, b is self-aligned with poly gates 78a,b. The silicide gates 73a,b are also self-aligned with those poly gates 78 a,b. These self aligned steps ensure high transfer efficiency of the CCD and they make the gap size 74 between Schottky Junction CCD gates a non critical factor in device operation.

The poly gates 78 may all be interconnected and constant potential may be applied to them so that they do not impair the change transfer in the channel.

The other option is to clock those poly gates 78 in the same manner that Schottky gates 73 are clocked. The poly gates 78 a,c, may be interconnected and connected to the clock of phase 2 type. The poly gates 78 b,d, may be interconnected and connected to the clock of phase 1 type. The value of voltages applied to poly gates 18 would vary from voltages applied to Schottky gates 73.

Figure 5B:
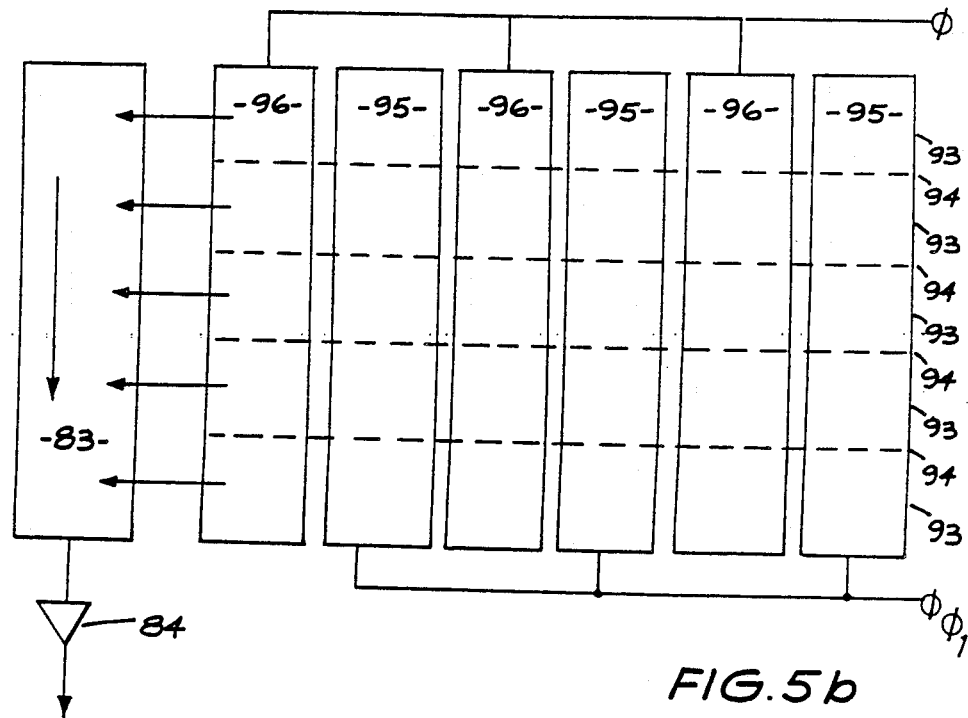

Referring to FIG. 5a a partial sectional elevation of a two phase infra-red half Schottky Junction CCD two dimensional array made in accordance with the present invention is shown. The device is made on n-type silicon with a p-type channel. There are two types of gates on this device, one is a Schottky junction type gate 91 as described in reference to the FIG. 4a, the other one is a conventional polysilicon (MOS) type gate 92. The processing sequence of the device allows self alignment of polysilicon and Schottky junction gates which in turn gives the best transfer efficiency factor for the CCD due to absence of any parasitic wells or barriers in the channel between the gates. The two dimensional array of FIG. 5b is similar to that of FIG. 4b with the exception that every second gate 92 in each row 93 is a conventional non-detecting polysilicon gate comprising a polysilicon layer 96 over an oxide layer 97. The $\phi_1$ and $\phi_2$ voltages are applied to the vertical metal and polysilicon lines 95 and 96 respectively to operate the multiple horizontal half SJ CCD lines. The operation of the device is similar to the one described with reference to FIG. 4. During the integration mode infra-red radiation generates charges under the Schottky junction gates 91, and these changes are subsequently transported out in the read-out mode. The fill factor for the device of FIGS. 4a and 4b is about 50% depending on the proportional dimensions of the Schottky junction type gates compared to that of the polysilicon gates, which do not have to be equal. The main advantage of the half IR SJ CCD is that the device processing parameters are not critical due to the self aligned step, which promises high yield of good devices in the manufacturing stage.

The devices described above are two phase type Schottky Junction CCD'S with a profiled implant channel (72) as described with reference to FIG. 3a and FIG. 4a. The principle of the device design and operation would be the same for a three phase type Schottky Junction CCD (or other multiphase CCD) with a uniformly implanted channel.

The unidirectional charge transfer would be achieved here by application of properly timed phase voltages to the Schottky Junction CCD gates, in a manner similar to a conventional 3 phase CCD (or other multiphase CCD).

While the embodiments have been described as being made on n-type silicon substrate with a p-type channel, due to the low Schottky barrier which results for metals used in infra-red sensing. It will be recognized that devices made on p-type substrate with an n-type channel will work in a very similar fashion to the device described with reference to FIG. 3a, and they will respond to a shorter infra-red radiation wavelength due to the higher value of the Schottky barrier in the silicide detection regions. On the other hand, the devices made on an n-type substrate may operate at much higher temperatures than those made on p-type substrate.

It will be recognised by persons skilled in the art that numerous variations and modifications may be made to the invention as described above without departing from the spirit or scope of the invention as broadly described.

We claim:

1. A Schottky junction charge coupled device infrared imaging array having substantially contiguous infrared sensitive elements with a full factor substantially greater than fifty percent, said imaging array comprising:

a plurality of substantially contiguous conductive transfer electrodes disposed along a semiconductor substrate above a buried implant channel and providing means for serially shifting charge packets within the buried channel of said substrate when a sequence of control voltages is applied thereto, each of said substantially contiguous transfer electrodes forming a rectifying metal to semiconductor contact known as a Schottky contact and having a barrier height sufficiently low to cause the Schottky contact to respond to infrared radiation of wavelength substantially greater than the band to band absorption cutoff wavelength of the semiconductor, an anti-reflective coating disposed on a side of the semiconductor substrate opposite said transfer electrodes, said Schottky contact acting in a first mode as an infrared detector element by photoemission of charge carriers from the metallic region of said Schottky contact to said buried channel of said semiconductor substrate and, in a second mode, to control movement of charge packets within said buried channel, operating in said first or second mode being determined by voltage sequences applied to said transfer electrodes.

2. The Schottky junction array as in claim 1 wherein tho array is a one dimensional array.

3. The Schottky junction array as claim in claim 1 wherein a plurality of one dimensional arrays are formed side by side to produce a two dimensional array.

4. The Schottky junction array of claim 3 wherein a one dimensional output array is provided, each element of the output array being connected to an output of a respective one dimensional array of the Schottky array such that the Schottky array can be read serially.

5. The Schottky junction array as in claim 3 wherein a further charge coupled device array is provided, having the same dimensions as the Schottky junction array, and into which the respective charges of the elements of the Schottky array can be rapidly read, the further array being connected to the Schottky array in a manner which allows simultaneous reading of each of the one dimensional arrays of the Schottky array into the respective row of the further array.

6. The Schottky junction array of claim 1 wherein the Schottky junction gates are formed as metal silicide Schottky barrier gates comprising a metal silicide layer formed on the surface of a doped substrate having an oppositely doped implanted channel with an inbuilt non-uniform profile.

7. The Schottky junction array as in claim 6 wherein the doped channel has two distinct regions within each gate structure, a first region being a heavily doped well region and a second region being a lightly doped barrier region.

8. The Schottky junction array as in claim 6 wherein the metal of the metal silicide layer is selected from Palladium, Iridium or Platinum.

9. The Schottky junction array as in claim 1 wherein the substrate is N-type silicon and the implanted channel has a P-type implant.

10. The Schottky junction array as in claim 1 wherein the substrate is P-type silicon and the implanted channel has an N-type implant.

11. A Schottky junction charge coupled device infrared imaging array having substantially contiguous infrared sensitive elements with a fill factor substantially greater than fifty percent, said imaging array comprising:

a plurality of substantially contiguous conductive transfer electrodes disposed along a semiconductor substrate above a buried implant channel and providing means for serially shifting charge packets within the buried channel of said substrate when a sequence of control voltages is applied thereto, each of said substantially contiguous transfer electrodes forming a rectifying metal to semiconductor contact known as a Schottky contact and having a barrier height sufficiently low to cause the Schottky contact to respond to infrared radiation of wavelength substantially greater than the band to band absorption cutoff wavelength of the semiconductor, said Schottky contact acting in a first mode as an infrared detector element by photoemission of charge carriers from the metallic region of said Schottky contact to said buried channel of said semiconductor substrate and, in a second mode, to control movement of charge packets within said buried channel, operating in said first or second mode being determined by voltage sequences applied to said transfer electrodes, a plurality of one dimensional arrays being formed side by side to produce a two dimensional array, a further charge coupled device array being provided, having the same dimensions as the Schottky junction array, and into which the respective charges of the elements of the Schottky array can be rapidly read, the further array being connected to the Schottky array in a manner which allows simultaneous reading of each of the one dimensional arrays of the Schottky array into the respective row of the further array, wherein the further array is a Schottky junction charge coupled device array which is shielded from radiation.

12. A Schottky junction charge coupled device infrared imaging array having substantially contiguous infrared sensitive elements with a fill factor substantially greater than fifty percent, said imaging array comprising:

a plurality of substantially contiguous conductive transfer electrodes disposed along a semiconductor substrate above a buried implant channel and providing means for serially shifting charge packets within the buried channel of said substrate when a sequence of control voltages is applied thereto, each of said substantially contiguous transfer electrodes forming a rectifying metal to semiconductor contact known as a Schottky contact and having a barrier height sufficiently low to cause the Schottky contact to respond to infrared radiation of wavelength substantially greater than the band to band absorption cutoff wavelength of the semiconductor, said Schottky contact acting in a first mode as an infrared detector element by photoemission of charge carriers from the metallic region of said Schottky contact to said buried channel of said semiconductor substrate and, in a second mode, to control movement of charge packets within said buried channel, operating in said first or second mode being determined by voltage sequences applied to said transfer electrodes, a plurality of one dimensional arrays being formed side by side to produce a two dimensional array, a one dimensional output charge coupled device array being provided, each element of the output array being connected to an output of a respective one dimensional array of the Schottky array such that the Schottky array can be read serially, a further charge coupled device array being provided, having the same dimensions as the Schottky junction array, and into which the respective charges of the elements of the Schottky array can be rapidly read, the further array being connected to the Schottky array in a manner which allows simultaneous reading of each of the one dimensional arrays of the Schottky array into the respective row of the further array, wherein the further array is a Schottky junction charge coupled device array which is shielded from radiation.

13. A Schottky junction charge coupled device infrared imaging array having a fill factor of infrared sensitive area substantially greater than fifty percent, said array comprising:

a plurality of substantially contiguous voltage-controlled gates having infrared sensitive Schottky barrier electrodes disposed along the surface of a semiconductor substrate wherein voltages applied to said gates produce potential variations within said semiconductor substrate which lead to the controlled movement of charge within said semiconductor, and means for projecting an infrared image onto said semiconductor substrate having a wavelength longer than the absorption cutoff wavelength of the semiconductor but shorter than the wavelength corresponding to the barrier height of the infrared sensitive Schottky barrier electrodes, wherein all of said gates each include a Schottky junction with said semiconductor with barrier height being sufficiently low that the junction is infrared sensitive at wavelengths longer than the absorption cutoff wavelength of the semiconductor but shorter than the wavelength corresponding to the barrier height of the infrared sensitive Schottky barrier electrodes, said Schottky junction gates thereby operating in a first mode as infrared detection elements and in a second mode to control the movement of charge within said semiconductor in response to a succession of different control voltages applied to the gates.

14. An array of substantially contiguous silicon-based Schottky junction gates, each gate being capable (a) of accumulating a packet electrical charge corresponding to the quantity of incident infrared photons during an imaging time and (b) of subsequently serially shifting such accumulated charge packets along said array to an output port, said array having an active infrared sensitive fill factor substantially greater than fifty percent and comprising:

a silicon-based semiconducting substrate having at least one channel therein along which impurities are doped at alternating first and second densities to define respectively corresponding alternating barrier and well regions along said channel;

a Schottky gate-defining semiconductor structure disposed above and across each successive pair of said barrier and well regions;

means for projecting an infrared image onto said semiconductor substrate having a wavelength longer than the absorption cutoff wavelength of the semiconductor but shorter than the wavelength corresponding to the barrier height of the infrared sensitive Schottky barrier region, and each nth one of said gate-defining structures being connected in parallel to respective n gate control ports whereby reverse-biased junctions may be maintained between each of said gate defining structures and its respectively associated barrier and well regions with infrared photon-inducted charges being accumulated in each said well when constant control voltages are applied to said gate control ports and where such accumulated charges are serially transferred along said channel from one gate to the next in a predetermined direction when suitably phased changing control voltages are applied to said gate control ports.

15. A Schottky junction charge coupled device as in claim 13 or 14 wherein the transfer electrodes are metal or metallic silicide layers.

16. A Schottky junction charge coupled device as in claim 15 wherein a dielectric passivating layer is located over the transfer electrodes.

17. A Schottky junction charge coupled device as in claim 16 wherein a mirror is located above the dielectric layer and the transfer electrodes are sufficiently thin to enable transmission of infrared light and the dielectric layer forms an optical cavity on top of the transfer electrode.

18. A Schottky junction charge coupled device as in claim 17 wherein the channel region is a p-type region.

19. A Schottky junction charge coupled device as in claim 18 wherein the transfer electrodes are composed of a metal selected from iridium, platinum and palladium or a silicide of one of these metals.

20. A Schottky junction charge coupled device infrared imaging array having substantially contiguous infrared sensitive elements with a fill factor substantially greater than fifty percent, said imaging array comprising:

a plurality of substantially contiguous conductive transfer electrodes disposed along a semiconductor substrate above a buried implant channel and providing means for serially shifting charge packets within the buried channel of said substrate when a sequence of control voltages is applied thereto, each of said substantially contiguous transfer electrodes forming a rectifying metal to semiconductor contact known as a Schottky contact and having a barrier height sufficiently low to cause the Schottky contact to respond to infrared radiation of wavelength substantially greater than the band to band absorption cutoff wavelength of the semiconductor, said Schottky contact acting in a first mode as an infrared detector element by photoemission of charge carriers from the metallic region of said Schottky contact to said buried channel of said semiconductor substrate and, in a second mode, to control movement of charge packets within said buried channel, operating in said first or second mode being determined by voltage sequences applied to said transfer electrodes, a dielectric passivating layer located over the transfer electrodes, and a mirror located above the dielectric layer, the transfer electrodes being sufficiently thin to enable transmission of infrared light and the dielectric layer forming an optical cavity on top of the transfer electrode.

21. A Schottky junction charge coupled device as in claim 20 wherein the channel region is a p-type region.

22. A Schottky junction charge coupled device as in claim 21 wherein the transfer electrodes are composed of a metal selected from iridium, platinum and palladium or a silicide of one of these metals.

* * * * *